United States Patent
Choi et al.

(10) Patent No.: US 8,339,565 B2
(45) Date of Patent: Dec. 25, 2012

(54) MOTHER SUBSTRATE FOR LIQUID CRYSTAL DISPLAY AND MANUFACTURING METHOD THEREOF

(75) Inventors: Ilman Choi, Daegu (KR); Yongmin Kim, Seongbuk-gu (KR)

(73) Assignee: LG Display Co., Ltd., Seoul (KR)

( * ) Notice: Subject to any disclaimer, the term of this patent is extended or adjusted under 35 U.S.C. 154(b) by 256 days.

(21) Appl. No.: 12/907,534

(22) Filed: Oct. 19, 2010

(65) Prior Publication Data

US 2011/0102694 A1    May 5, 2011

(30) Foreign Application Priority Data

Oct. 30, 2009  (KR) ........................ 10-2009-0104372

(51) Int. Cl.
*G02F 1/1333*    (2006.01)
*G02F 1/1343*    (2006.01)

(52) U.S. Cl. ............................ 349/158; 349/160; 349/39
(58) Field of Classification Search .................. 349/158, 349/160, 39
See application file for complete search history.

(56) References Cited

U.S. PATENT DOCUMENTS

2007/0290375 A1* 12/2007 Huang .......................... 257/786
2008/0006834 A1*  1/2008 Fujita .............................. 257/83

* cited by examiner

*Primary Examiner* — Mike Qi
(74) *Attorney, Agent, or Firm* — McKenna Long & Aldridge, LLP

(57) ABSTRACT

A mother substrate for a liquid crystal display comprises a plurality of active matrix arrays, test lines connected to the active matrix arrays, test pads connected to the test lines, and connection lines connecting test lines to each other.

10 Claims, 6 Drawing Sheets

US 8,339,565 B2

MOTHER SUBSTRATE FOR LIQUID CRYSTAL DISPLAY AND MANUFACTURING METHOD THEREOF

This application claims the benefit of Korea Patent Application No. 10-2009-0104372 filed on Oct. 30, 2009, the entire contents of which is incorporated herein by reference for all purposes as if fully set forth herein.

BACKGROUND OF THE INVENTION

1. Field of the Invention

This document relates to a mother substrate provided with a plurality of active matrix arrays and a manufacturing method thereof.

2. Related Art

A liquid crystal display ("LCD") has been widely applied due to its lightweight, thin profile, lower power consumption driving, and so on. Such an LCD has been employed as a portable computer such as a notebook PC, an office automation device, an audio/video device, an indoor/outdoor advertisement display device or the like.

Referring to FIG. 1, a lower glass substrate GLSL of the active matrix LCD is provided with data lines DL and gate lines GL intersecting each other. At the intersections of the data lines DL and the gate lines GL, TFTs (thin film transistors) and pixel electrodes, which are connected to each other, are arranged in a matrix. An upper glass substrate GLSU is provided with black matrices BM, color filters CF, and common electrodes COM. A lower polarizer is attached to a light incidence plane of the lower glass substrate GLSL, and an upper polarizer, having the light absorption axis perpendicular to the light absorption axis of the lower polarizer, is attached to a light emission plane of the upper glass substrate GLSU. In addition, alignment layers are formed having contact with a liquid crystal layer LC between the lower glass substrate GLSL and the upper glass substrate GLSU.

In order to increase productivity of the LCD, a plurality of active matrix arrays are formed on a large-sized mother substrate together, and thereafter the active matrix arrays are divided into each other through a scribing process and a grinding process.

In the course of thin film patterning on the mother substrate, static electricity is generated during the deposition process, the etching process, and so forth. If line materials formed on the mother substrate are metals with low resistance, the static electricity is easily applied to the active matrix arrays via the line materials. The static electricity deteriorates characteristics of elements in the active matrix arrays or causes dielectric breakdown.

SUMMARY OF THE INVENTION

Embodiments of this document provide a mother substrate of a liquid crystal display and a manufacturing method thereof, capable of blocking static electricity generated during manufacturing of the mother substrate.

According to an exemplary embodiment of this document, there is provided a mother substrate for a liquid crystal display, comprises a plurality of active matrix arrays; test lines connected to the active matrix arrays; test pads connected to the test lines; and first connection lines connecting test lines to each other.

Each of the active matrix arrays may comprise a TFT array including data lines, gate lines intersecting the data lines, TFTs connected to the data lines and the gate lines, pixel electrodes connected to the TFTs, and storage capacitors connected to the pixel electrodes; a driving circuit unit sequentially supplying gate pulses to the gate lines; and LOG lines connecting the test lines to the driving circuit unit.

Each of the active matrix arrays may further comprise second connection lines connecting the LOG lines to each other.

According to an exemplary embodiment of this document, there is provided a method of manufacturing a mother substrate of a liquid crystal display, comprising forming a plurality of active matrix arrays, test lines connected to the active matrix arrays, test pads connected to the test lines, and first connection lines connecting the test lines to each other on the mother substrate, respectively; forming a passivation layer covering the plurality of active matrix arrays, the test lines, the test pad, and the connection lines on the mother substrate; and forming a first open hole disconnecting the first connection lines during an etching process of the passivation layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Figure 1:
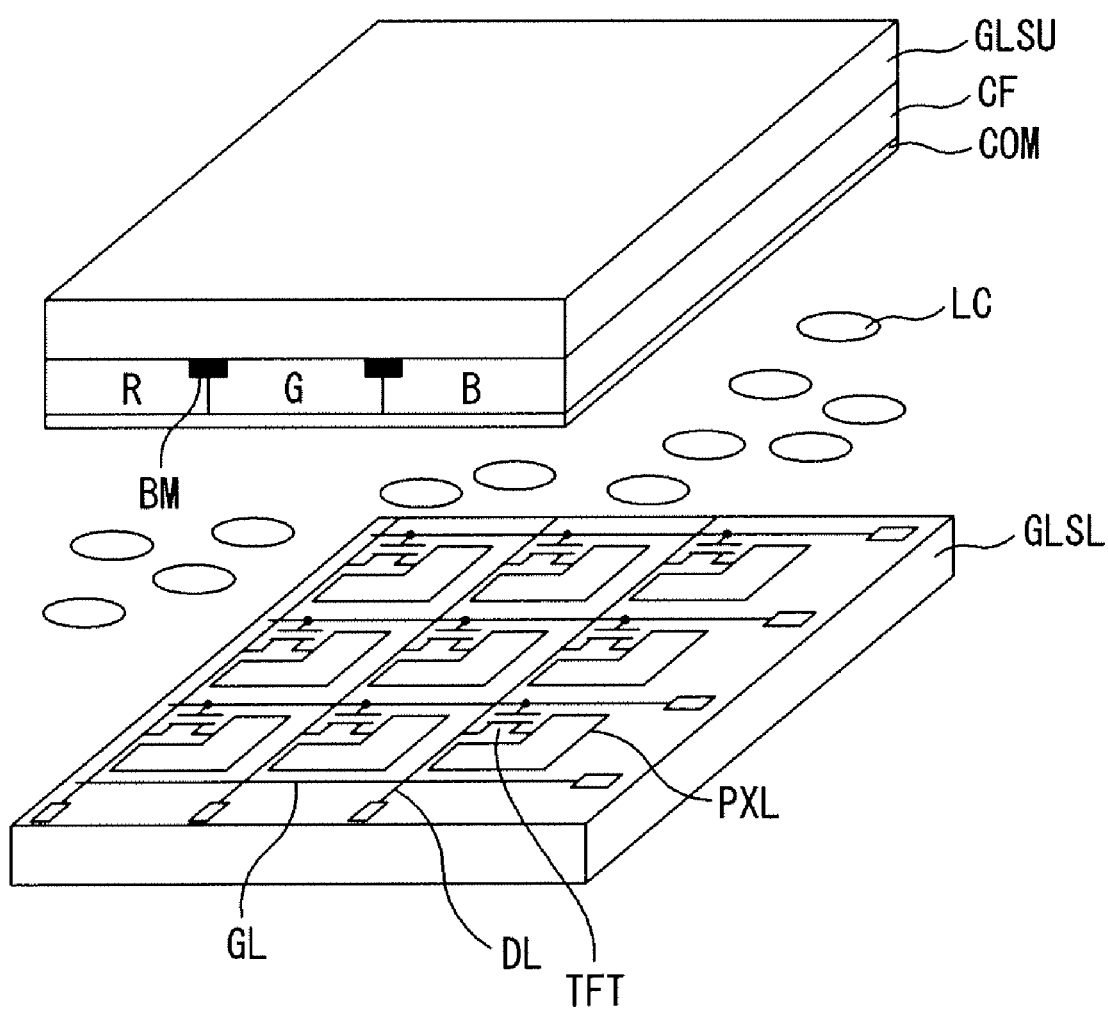
FIG. 1 is a perspective view schematically illustrating an LCD.

Hereinafter, embodiments of this document will be described in detail with reference to the accompanying drawings. Like reference numerals designate like elements throughout the specification. In the following description, when a detailed description of well-known functions or configurations related to this document is determined to unnecessarily cloud a gist of the present invention, the detailed description thereof will be omitted.

The LCD according to this document may be implemented, when classified by LC modes, by a TN (twisted nematic) mode, a VA (vertical alignment) mode, an IPS (in plane switching) mode, an FFS (fringe field switching) mode, or the like. In view of a structure, the LCD according to this document may be implemented by any other type, for example, such as a transmissive LCD, a transflective LCD, a reflective LCD, or the like. The transmissive LCD and the transflective LCD require a backlight unit. The backlight unit may be implemented by a direct type backlight unit or an edge type backlight unit.

Figure 2:
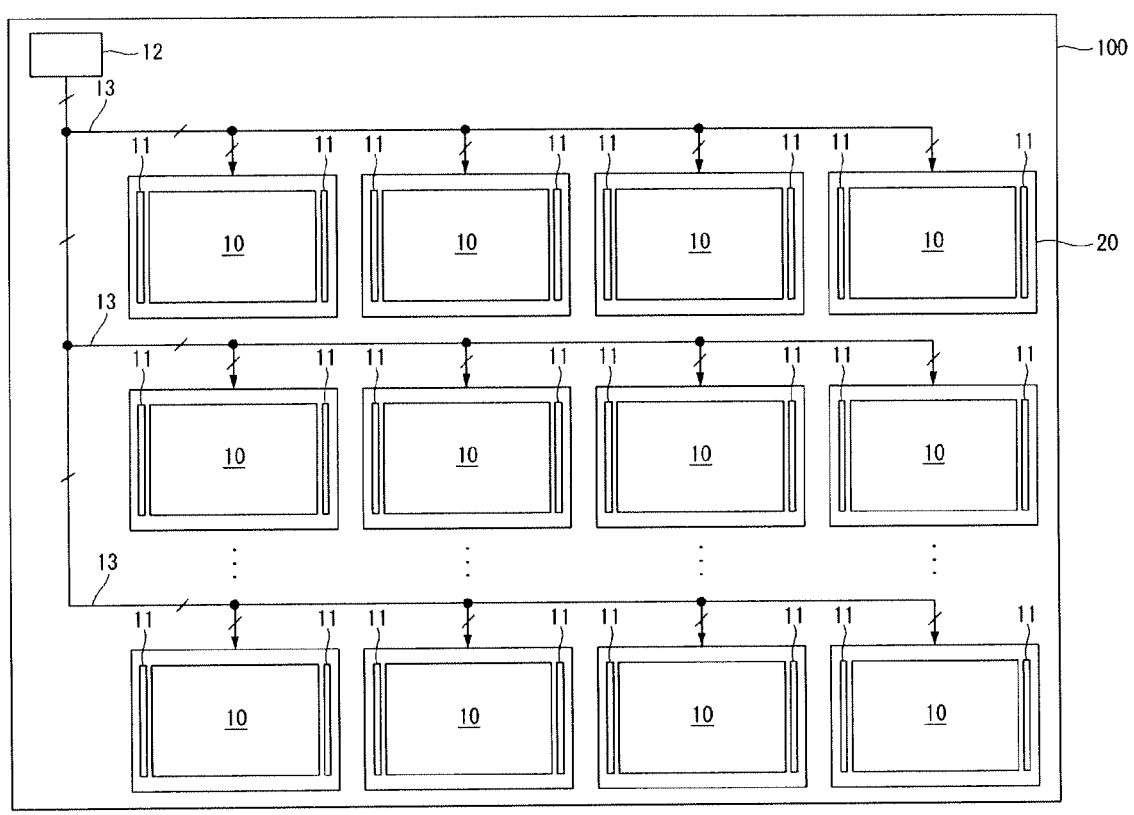
FIG. 2 is a plan view illustrating a mother substrate of an LCD according to an embodiment of this document.

According to this document, during manufacturing the LCD, a plurality of active matrix arrays is formed together on a mother substrate 100 as shown in FIG. 2.

Figure 3:
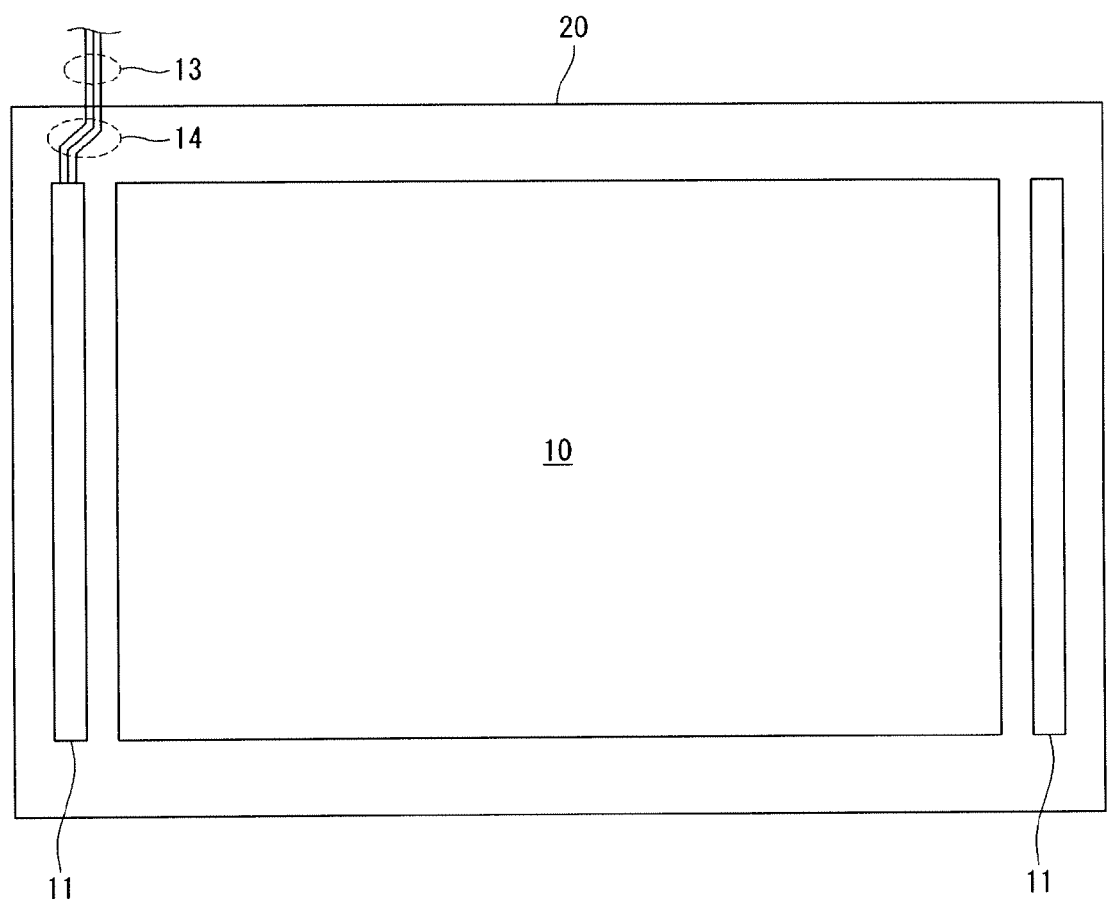
FIG. 3 is an enlarged plan view illustrating the active matrix array shown in FIG. 2.
Figure 4:
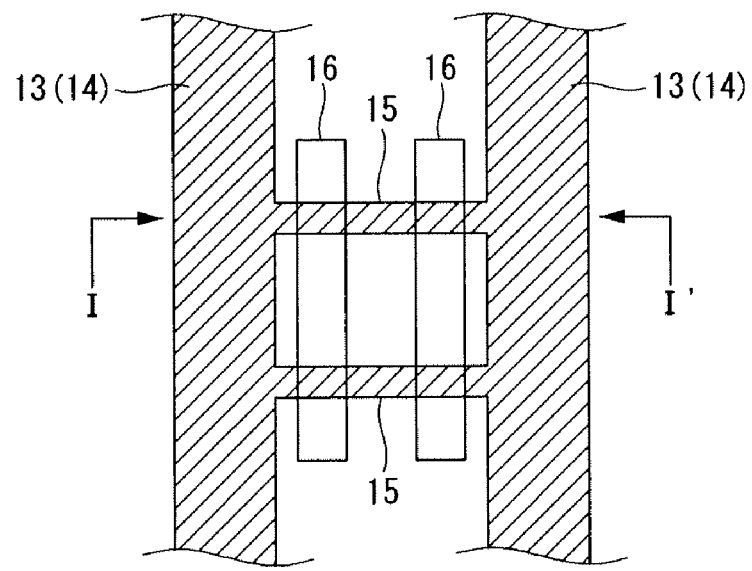
FIG. 4 is a plan view illustrating connection lines formed between test lines, and between LOG lines.

In FIGS. 2 and 3, the mother substrate 100 is provided with a plurality of active matrix arrays 20, a test pad 12, and test lines 13.

Each of the active matrix arrays 20 is provided with a TFT array 10, a driving circuit unit 11 for driving the TFT array 10, and LOG (line on glass) lines 14. The TFT array 10 is provided with data lines, gate lines intersecting the data lines, TFTs connected to the data lines and the gate lines, pixel electrodes connected to the TFTs, storage capacitors connected to the pixel electrodes, and so forth. The driving circuit unit 11 comprises gate driving circuits for sequentially gate pulses to the gate lines. The LOG lines 14 connect the test lines 13 to the driving circuit unit 11.

The test pads 12 have contact with a probe of an external test jig and supplies a test signal and a driving power output from the test jig to the test lines 13. The test pad is formed at one edge of the mother substrate 100.

The test lines 13 are formed between the test pad 12 and the LOG lines 14, and transmit the test signal and the driving power from the test pad to the LOG lines 14.

A thin film patterning process of the mother substrate 100 includes a plurality of deposition and etching processes, thereby forming thin film patterns in the TFT array 10, the driving circuit unit 11 for driving the TFT array 10, the LOG lines 14, the test pad 12, and the test lines 13.

In order to block static electricity generated during the deposition process and the etching process, in this document, connection lines 15 are formed between the test lines 13 so as to be connected to each other. Also, in this document, the connection lines 15 are formed between the LOG lines 14 so as to be connected to each other. Static electricity is dispersed through the connection lines 15 and thereby static electricity flowing towards the driving circuit unit 11 can be blocked. The connection lines 15 do not comprise diodes or transistor elements, but comprises only metal line patterns The connection lines 15 may be formed of gate line patterns and/or source/drain metal patterns. Thus, there is no need for a separate process for forming the connection lines 15.

Figure 5:
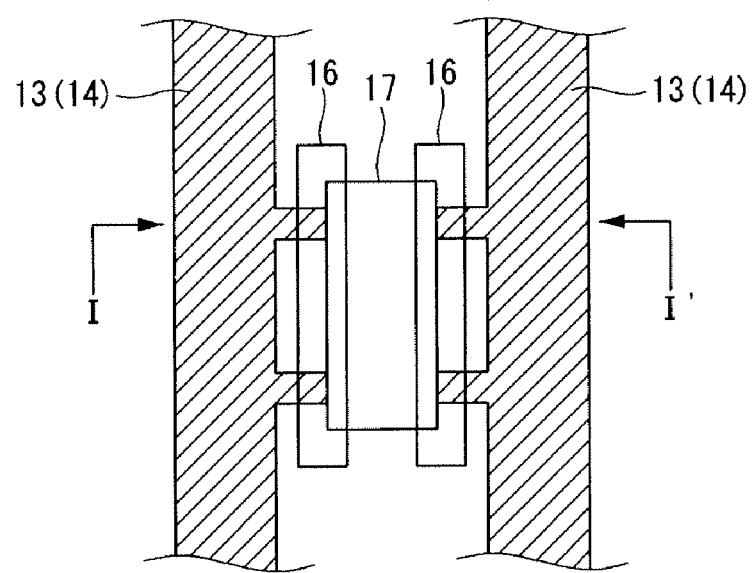
FIG. 5 is a plan view illustrating connection lines removed during an etching process of a passivation layer.

The connection lines 15 are removed by an open hole 17 which is formed during an etching process of a passivation layer as shown in FIG. 5. Transparent conductive patterns 16 are formed at both edges of the open hole 17. The transparent conductive patterns 16 prevent remaining metals of the connection lines 15 from being exposed to air and thus the metals being oxidized. After the connection lines 15 are removed, the probe of the test jig has contact with the test pad 12. When the test jig has contact with the test pad 12, the active matrix arrays are all inspected at the same time. Following the inspection, the active matrix arrays are individually separated from each other through a scribing process and a grinding process.

The mother substrate 100 in this document can be manufactured using the two-mask process, the three-mask process, or the four-mask process in the related art. An embodiment of a method of manufacturing the mother substrate 100 will be described by exemplifying the four-mask process. Of course, the mother substrate 100 may be manufactured using the two-mask process or the three-mask process.

Figure 6:
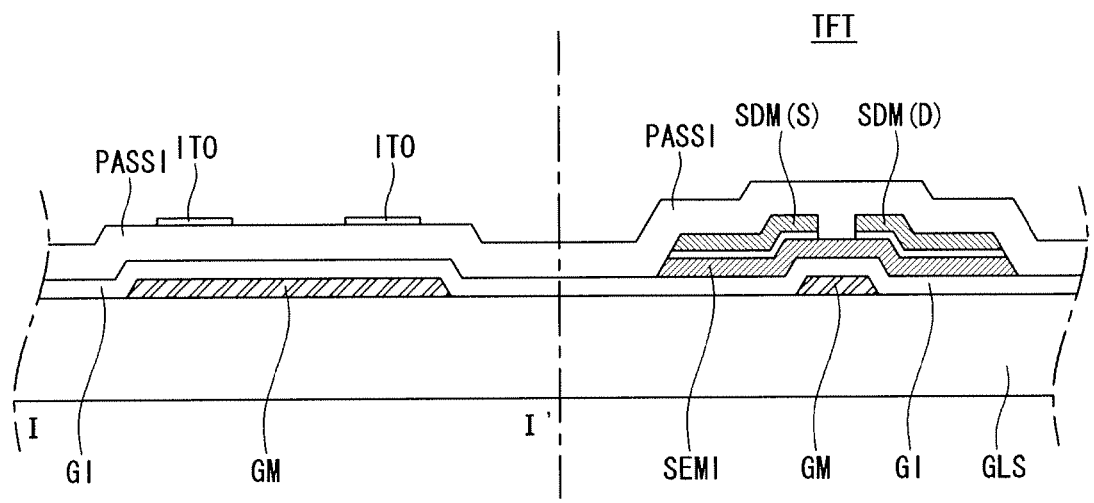
FIG. 6 is a sectional view taken along the line I-I' in FIG. 4 and shows an example where the connection lines are formed of gate metal patterns.
Figure 7:
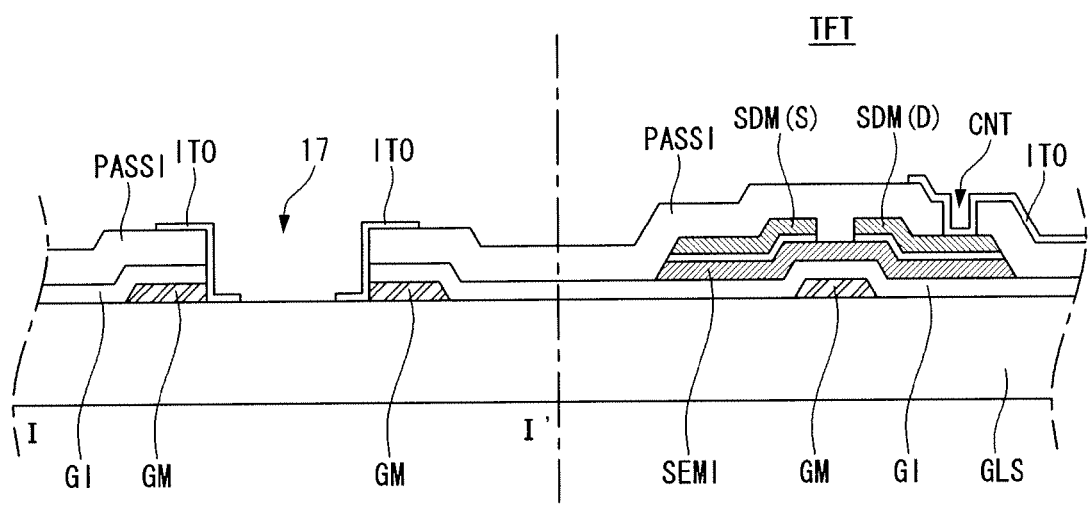
FIG. 7 is a sectional view taken along the line I-I' in FIG. 5 and shows disconnection of the connection lines shown in FIG. 6.

FIG. 6 is a sectional view illustrating an example where the connection lines 15 is formed of a gate metal pattern. FIG. 7 is a sectional view illustrating disconnection of the connection lines 15 shown in FIG. 6.

Referring to FIGS. 6 and 7, in a manufacturing method of the mother substrate according to a first embodiment, a gate metal layer is formed on the mother substrate 100 using a deposition method such as sputtering. The gate metal may be selected from an aluminum (Al) based metal including aluminum/neodymium (AlNd), molybdenum (Mo), copper (Cu), chrome (Cr), tantalum (Ta), titanium (Ti), or the like.

The gate metal layer is patterned during a first photolithography process. The gate lines, gate electrodes and gate pads of the TFTs connected to the gate lines, in the TFT array 10, and the like are formed of the gate metal pattern GM. Along with the gate metal pattern GM in the TFT array 10, the gate metal pattern of the driving circuit unit 11, and the gate metal pattern GM of the test lines 12 and the connection lines 15 are formed.

Next, a gate insulating layer GI, a semiconductor layer, and a source/drain metal layer are consecutively deposited to cover the gate metal patterns GM. The gate insulating layer GI may be made of an inorganic insulating material such as silicon oxide (SiOx) or silicon nitride (SiNx). The source/drain metal may be selected from molybdenum (Mo), titanium (Ti) tantalum (Ta), molybdenum alloy, copper (Cu), or the like. The semiconductor layer and the source/drain metal layer are patterned together during a second photolithography process. The semiconductor pattern SEMI includes an amorphous silicon layer doped with no impurities and an ohmic contact layer doped with impurities. The data lines and the source/drain electrodes SDM(S) and SDM(D) in the TFT array 10, and data pads are formed of source/drain metal pattern. Along with the source/drain metal pattern in the TFT array 10, the source/drain metal pattern of the driving circuit unit 11 and the source/drain metal pattern of the test lines 12 are formed.

Subsequently, a passivation layer PASSI covering the active matrix array 20, the test pad 12, and the test lines 13 is deposited on the mother substrate 100. The passivation layer PASSI may be made of inorganic insulating material the same as the gate insulating layer GI, acryl based organic compound with a small dielectric constant, or organic insulating material such as BCB (bebzocyclobutane) and PFCB (perfluorocyclobutane).

Next, the passivation layer PASSI is etched during a third photolithography process. During the third photolithography process, as shown in FIG. 7, a contact hole CNT for exposing a portion of the drain electrode SDM(D) of the TFT of the active matrix array 20, the open hole 17 for disconnecting the gate metal pattern GM of the connection lines 15, and contact holes for exposing the gate metal pattern and the source/drain metal pattern of the test pad 12 are formed together.

Thereafter, a transparent conductive layer covering the passivation layer PASSI is deposited and then the transparent conductive layer is patterned during a fourth photolithography process. The transparent conductive layer may be made of indium tin oxide (ITO), tin oxide (TO), indium tin zinc oxide (ITZO), or indium zinc oxide (IZO). The transparent conductive layer pattern comprises the pixel electrodes of the active matrix array 20, top electrodes of the gate pads and the data pads, a top electrode of the test pad 12, and top electrodes covering the edges of the open hole 17.

Figure 8:
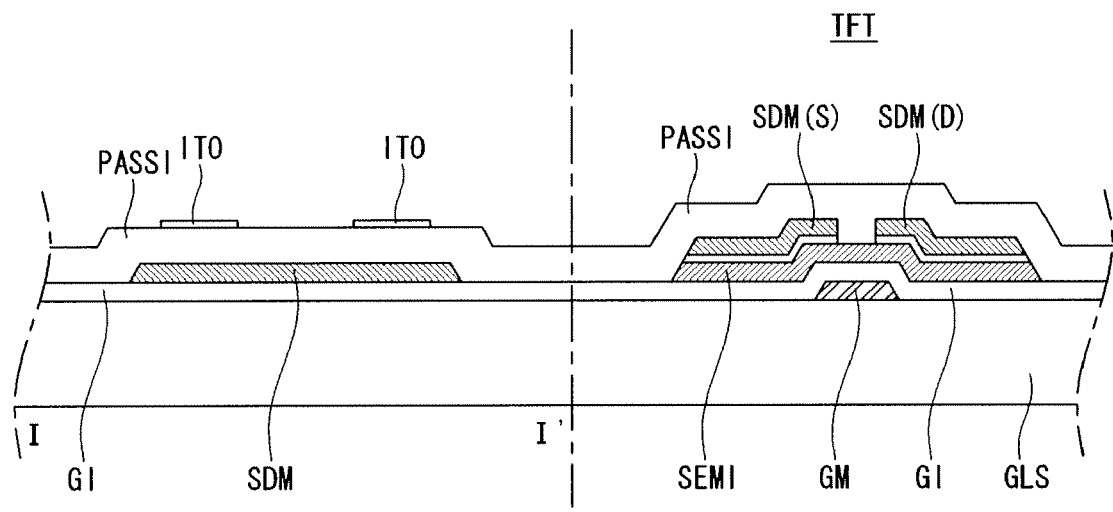
FIG. 8 is a sectional view taken along the line I-I' in FIG. 4 and shows an example where the connection lines are formed of source/drain metal patterns.
Figure 9:
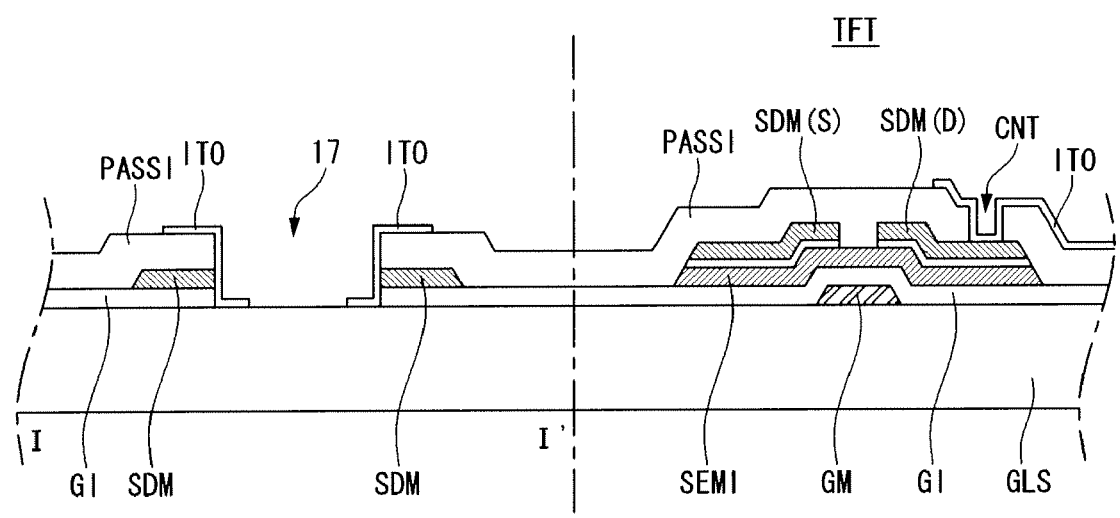
FIG. 9 is a sectional view taken along the line I-I' and shows disconnection of the connection lines shown in FIG. 8.

FIG. 8 is a sectional view illustrating an example where the connection lines 15 are formed of the source/drain metal patterns. FIG. 9 is a sectional view illustrating disconnection of the connection lines 15 shown in FIG. 8.

Referring to FIGS. 8 and 9, in a manufacturing method of a mother substrate according to a second embodiment of this document, the connection lines 15 are formed of the source/drain metal patterns SDM, and the connection lines 15 are disconnected during the etching process of the passivation layer PASSI. The order of the manufacturing processes is substantially the same as in the above-described first embodiment.

As described above, in this document, the test lines on the mother substrate are connected to each other using the connection lines, and the connection lines are disconnected during the etching process of the passivation layer, thereby blocking static electricity generated during the deposition process, the etching process, and so forth, by using the connection lines.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mother substrate for a liquid crystal display, comprising:
   a plurality of active matrix arrays;
   test lines connected to the active matrix arrays;
   test pads connected to the test lines; and
   first connection lines connecting test lines to each other.

2. The mother substrate of claim 1, wherein each of the active matrix arrays comprises:
   a TFT array including data lines, gate lines intersecting the data lines, TFTs connected to the data lines and the gate lines, pixel electrodes connected to the TFTs, and storage capacitors connected to the pixel electrodes;
   a driving circuit unit sequentially supplying gate pulses to the gate lines; and
   LOG lines connecting the test lines to the driving circuit unit.

3. The mother substrate of claim 2, wherein each of the active matrix arrays further comprises second connection lines connecting the LOG lines to each other.

4. A method of manufacturing a mother substrate of a liquid crystal display, comprising:
   forming a plurality of active matrix arrays, test lines connected to the active matrix arrays, test pads connected to the test lines, and first connection lines connecting the test lines to each other on the mother substrate, respectively;
   forming a passivation layer covering the plurality of active matrix arrays, the test lines, the test pad, and the connection lines on the mother substrate; and
   forming a first open hole disconnecting the first connection lines during an etching process of the passivation layer.

5. The method of claim 4, further comprising forming transparent conductive patterns on edges of the first open hole.

6. The method of claim 5, wherein each of the active matrix arrays comprises:
   a TFT array including data lines formed of source/drain metal patterns, gate lines intersecting the data lines and formed of gate metal patterns, TFTs connected to the data lines and the gate lines, pixel electrodes connected to the TFTs, and storage capacitors connected to the pixel electrodes;
   a driving circuit unit sequentially supplying gate pulses to the gate lines; and
   LOG lines connecting the test lines to the driving circuit unit.

7. The method of claim 6, wherein the step of forming of the first connection lines on the mother substrate comprises forming second connection lines connecting the LOG lines to each other.

8. The method of claim 7, wherein the step of forming of the first open hole comprises
   forming a second open hole disconnecting the second connection lines during the etching process of the passivation layer.

9. The method of claim 8, wherein the first and second connection lines are formed of the source/drain metal patterns.

10. The method of claim 8, wherein the first and second connection lines are formed of the gate metal patterns.

* * * * *